United States Patent [19]
Niedermeier

[11] Patent Number: 5,390,070
[45] Date of Patent: Feb. 14, 1995

[54] CLOCKED POWER END STAGE FOR INDUCTIVE LOADS

[75] Inventor: Ernst Niedermeier, Neutraubling, Germany

[73] Assignee: Siemens Aktiengesellschaft, Munich, Germany

[21] Appl. No.: 867,764

[22] Filed: Apr. 13, 1992

[30] Foreign Application Priority Data

Apr. 11, 1991 [EP] European Pat. Off. .......... 91 105787

[51] Int. Cl.⁶ ...................... H01H 47/32; G05F 1/575
[52] U.S. Cl. ..................... 361/152; 323/285
[58] Field of Search ............... 323/222, 282, 285, 351,
323/283, 286, 287; 361/143, 146, 152, 153, 154,
160, 170, 187, 190; 307/89, 90, 104, 130, 131,
248

[56] References Cited

U.S. PATENT DOCUMENTS

| 3,517,301 | 6/1970 | Huber | 323/285 |
|---|---|---|---|
| 4,257,090 | 3/1981 | Kröger et al. | 323/222 |
| 4,540,893 | 9/1985 | Bloomer | 307/248 |
| 4,661,766 | 4/1987 | Hoffman . | |
| 4,887,021 | 12/1989 | Walker | 361/111 X |
| 4,949,211 | 8/1990 | Edwards . | |
| 4,987,361 | 1/1991 | Ohms | 323/222 |

FOREIGN PATENT DOCUMENTS 2140996 12/1984 United Kingdom .

Primary Examiner—A. D. Pellinen
Assistant Examiner—Fritz M. Fleming
Attorney, Agent, or Firm—Herbert L. Lerner; Laurence A. Greenberg

[57] ABSTRACT

In a clocked power end stage for an inductive load with a free-wheeling circuit, the speed of variation of the voltage at a connecting point between a load and a switch device as well as the speed of variation of the load current flowing through the switch device is adjustable, and in fact independently of the speed of variation of the voltage. In this way, a voltage which is proportional to the load current and one which is proportional to the drain voltage are respectively differentiated, and the signals so received are superimposed on the control clock signal for the switch device. With these measures, the electromagnetic disturbances caused by the clocking can be reduced.

9 Claims, 3 Drawing Sheets

CLOCKED POWER END STAGE FOR INDUCTIVE LOADS

BACKGROUND-PRIOR ART

The invention relates to a clocked power end stage for inductive loads, including a free-wheeling circuit, a series circuit being located at poles of a voltage source and having the load and a switch device, in particular a bipolar or MOS transistor, with a continuous transition between ON and OFF states, and a control circuit for generating a control clock signal for the switch device.

In order to control inductive loads, clocked power end stages with transistors, especially MOSFETs, are often used, because they have a lower power loss. A disadvantage of such clocked end stages is that they cause considerable electromagnetic interference.

One known cause of the electromagnetic interference is a rapid change in voltage brought about by the clocking, at a connecting point between the load and the switch device. Such a cause of electromagnetic interference is encountered, in circuits with MOSFETs for instance, by high-impedance triggering of the control terminal by means of a resistor.

Another cause of the electromagnetic interference that is brought about is a rapid change in the current flowing through the switch device, which is effected by the clocking. The speed of the change in current depends on the steepness of a free-wheeling or recovery diode, that is typically connected parallel to the inductive load, and on the aforementioned speed of the voltage change at the connecting point between the load and the switch device.

While it is virtually impossible to vary the steepness of the diode, the speed of the voltage change can be varied, as already noted, by means of high-impedance triggering of the switch device. However, in order to effect the necessary lessening in the speed of the current change, the speed of the voltage change would have to be reduced substantially more markedly than would be necessary for reducing the electromagnetic interference caused by the voltage change itself. However, in that case, the power loss arising in the switch device would be increased to such an extent that the advantage attained by the clocked triggering would be lost after all.

It is accordingly an object of the invention to provide a clocked power end stage for inductive loads, which overcomes the hereinafore-mentioned disadvantages of the heretofore-known devices of this general type and to do so in such a way that the electromagnetic interference brought about by it is reduced further, yet without substantially increasing the power loss.

SUMMARY OF THE INVENTION

With the foregoing and other objects in view there is provided, in accordance with the invention, a clocked power end stage for inductive consumers or loads, comprising an inductive load; a free-wheeling circuit connected to the load; a switch device, in particular a bipolar or MOS transistor, having a continuous transition between ON and OFF states, the switch device being connected to the load in a series circuit located at poles of a voltage source with a connection point between the switch device and the load; a control circuit for generating a control clock signal for the switch device; a current measuring device connected to the switch device for measuring a parameter selected from the group consisting of a load current flowing through the switch device and a signal proportional to the load current, the current measuring device supplying an output signal; a first differentiation device with a predeterminable time constant being connected to the current measuring device for generating an output signal associated with a variation over time of the output signal of the current measuring device; a voltage measuring device connected to the connection point for measuring a parameter selected from the group consisting of a load voltage at the connection point and a signal proportional to the load voltage, the voltage measuring device supplying an output signal; a second differentiation device with a predeterminable time constant being connected to the voltage measuring device for generating an output signal associated with a variation over time of the output signal of the voltage measuring device; and a linking element connected to the differentiation devices, to the control circuit and to the switch device for superimposing the output signals of the differentiation devices on the control clock signal to limit speeds of variation of the load current and the load voltage.

With the objects of the invention in view, there is also provided a clocked power end stage for inductive consumers or loads, comprising an inductive load; a free-wheeling circuit connected to the load; a switch device, in particular a bipolar or MOS transistor, having a continuous transition between ON and OFF states, the switch device being connected to the load in a series circuit located at poles of a voltage source with a connection point between the switch device and the load; a control circuit for generating a control clock signal for the switch device; a current measuring device in the free-wheeling circuit for measuring a parameter selected from the group consisting of a current flowing through the free-wheeling circuit and a signal proportional to the current, the current measuring device supplying an output signal; a first differentiation device with a predeterminable time constant being connected to the current measuring device for generating an output signal associated with a variation over time of the output signal of the current measuring device; a voltage measuring device connected to the connection point for measuring a parameter selected from the group consisting of a load voltage at the connection point and a signal proportional to the load voltage, the voltage measuring device supplying an output signal; a second differentiation device with a predeterminable time constant being connected to the voltage measuring device for generating an output signal associated with a variation over time of the output signal of the voltage measuring device; and a linking element connected to the differentiation devices, to the control circuit and to the switch device for superimposing the output signals of the differentiation devices on the control clock signal to limit speeds of variation of the load current and the load voltage.

In accordance with another feature of the invention, the current measuring device measures a voltage proportional to the current flowing through the switch device or through the free-wheeling circuit.

In accordance with a concomitant feature of the invention, the first differentiation device has an input and an output, and there is provided an inverting amplifier connected upstream of the input or downstream of the output of the first differentiation device.

The circuit according to the invention offers the advantage of adjusting the speed of current change independently of the speed of voltage change, and of making both variables only precisely steep enough to ensure that no substantial interference arises.

Other features which are considered as characteristic for the invention are set forth in the appended claims.

Although the invention is illustrated and described herein as embodied in a clocked power end stage for inductive loads, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
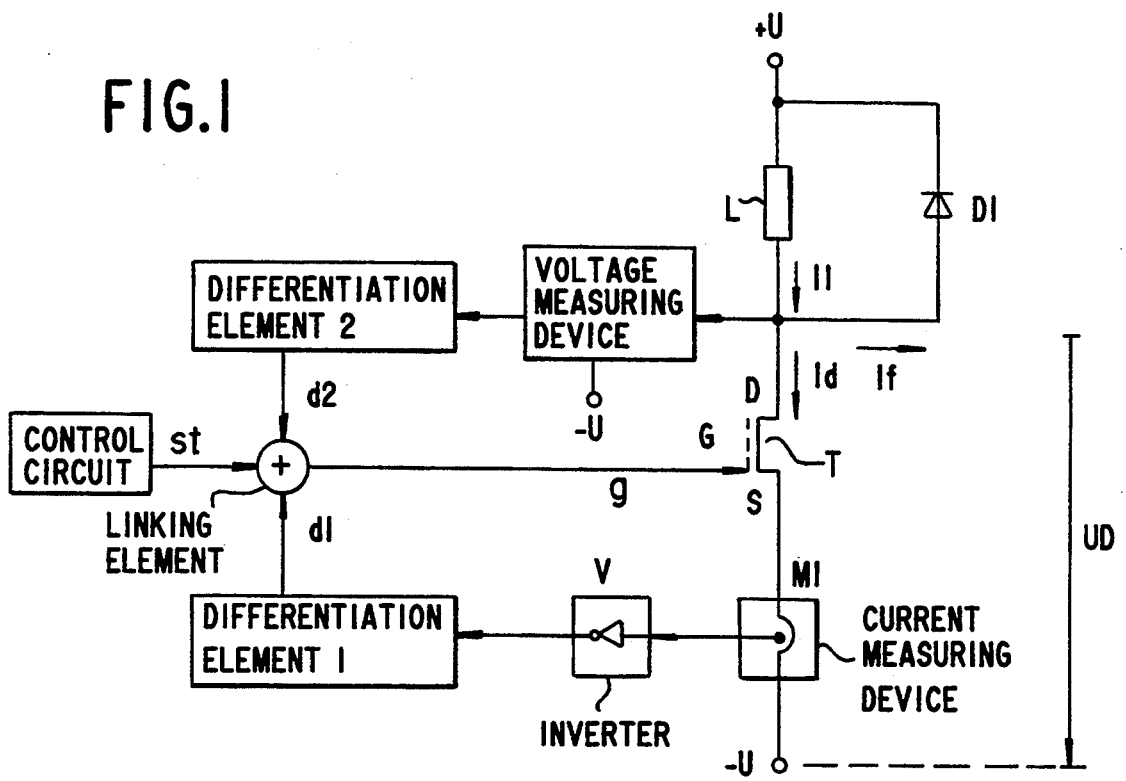
FIG. 1 is a schematic and block circuit diagram of a first exemplary embodiment of the invention.
Figure 2:
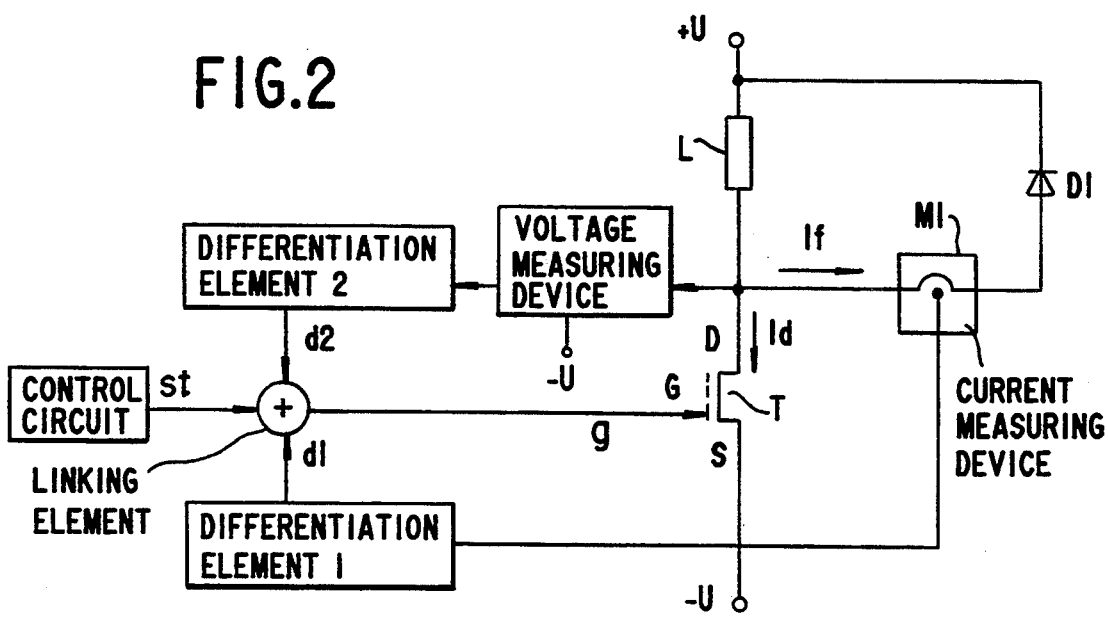
FIG. 2 is a view similar to FIG. 1 of a second exemplary embodiment of the invention.

Referring now to the figures of the drawings in detail and first, particularly to FIGS. 1 and 2 thereof, there are seen exemplary embodiments of the invention which implicitly contain a known circuit of a clocked power end stage. It includes a series circuit of an inductive load or consumer L and a switch device T constructed as a MOSFET, with a connecting point therebetween. The series circuit is located at poles $+U$, $-U$ of a non-illustrated voltage source. The load L is located between the drain terminal D of the switch device T and the positive pole $+U$ of the voltage source. The source terminal S of the switch device T is in FIG. 2 connected directly to the negative pole $-U$. The output of a control circuit ST, which generates a rectangular control clock signal st, is connected directly through a non-illustrated resistor to the gate terminal G of the switch transistor T. A free-wheeling or recovery diode DI is connected parallel to the load L.

Figure 3:
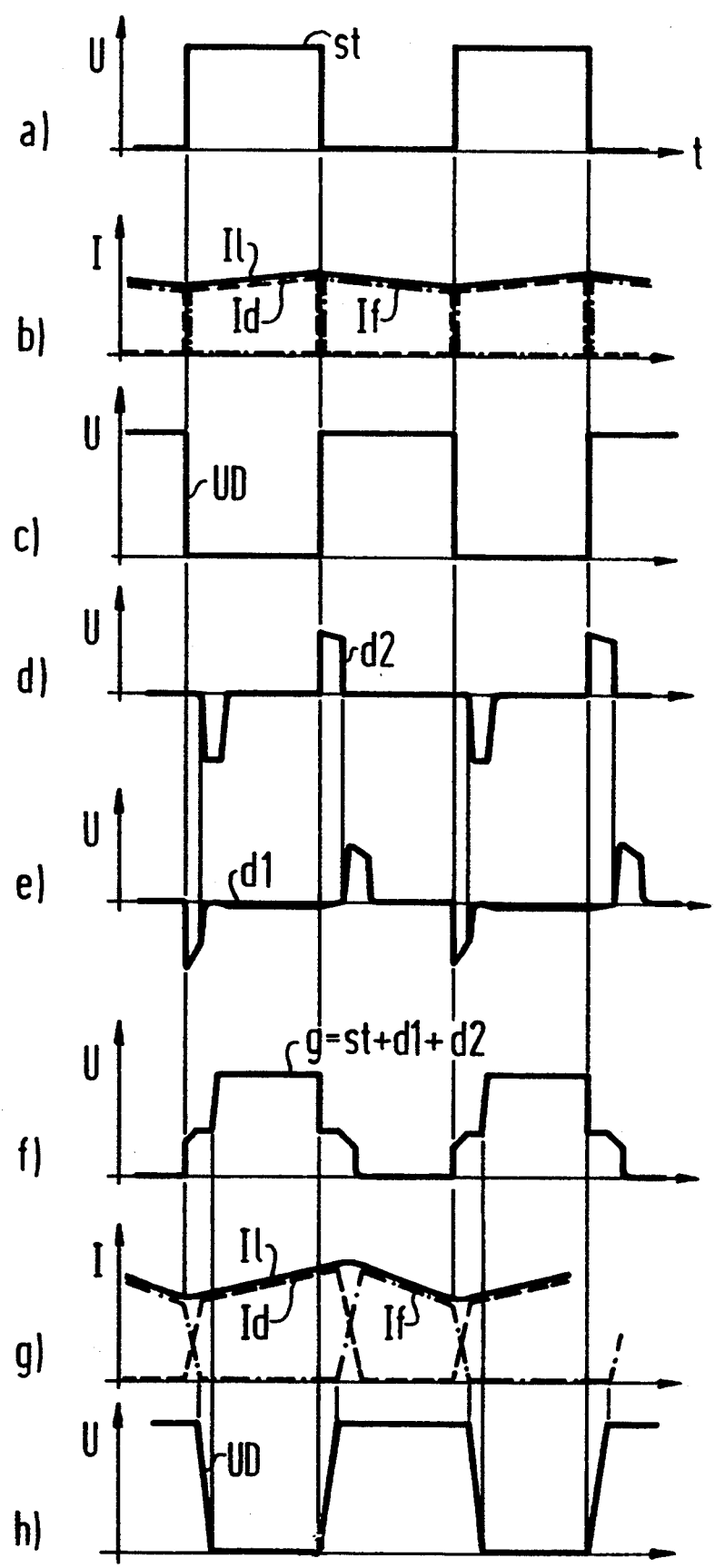
FIGS. 3a–h is a group of diagrams showing the course of voltages and current.

The control clock signal st is shown in a diagram a of FIG. 3. A diagram b of FIG. 3 shows currents caused by the control clock signal st through the switch transistor T (dashed lines Id), through the free-wheeling or recovery diode DI (dot-dashed lines If), and through the load L (solid line Il). A voltage UD measured between the drain terminal D and the negative pole $-U$ is shown in a diagram c of FIG. 3.

The diagrams b and c of FIG. 3 show the steep voltage edges of the voltage UD at the drain terminal D and the steep current edges of the currents Id in the switch transistor T and If in the free-wheeling or recovery diode DI (and in the voltage source $+U$, $-U$), that cause the undesired electromagnetic interference. Based on this known circuit, FIG. 1 shows a schematic circuit diagram of a first device according to the invention. In addition to the known elements, a current measuring device MI for the current Id flowing through the switch transistor T is provided. In the exemplary embodiment of FIG. 1, the current measuring device MI is disposed between the source terminal S of the switch device T and the negative pole $-U$ of the voltage source.

The current measuring device MI is followed by an inverter element V, which in turn is followed by a first differentiation element DIF1, in which an output signal of the current measuring device MI (shown in the diagram b of FIG. 3), that is proportional to the current Id but inverted, is differentiated.

A voltage measuring device MU which is also provided measures the voltage UD applied to the drain terminal D. The voltage measuring device MU is likewise followed by a second differentiation element DIF2, which differentiates the measured voltage UD. An output signal d2 of this differentiation element DIF2 is shown in a diagram d of FIG. 3. The output signals d1 (in the diagram e of FIG. 3) and d2 (in the diagram d of FIG. 3) are superimposed, for example by adding, to the control clock signal st (in the diagram a of FIG. 3) in a linking member U, in the direction of weakening or limiting its speed of variation.

The outcome of this superposition is a trigger signal g, which is delivered to the gate terminal G of the switch transistor T instead of the control clock signal st. The course of the trigger signal g is shown in a diagram f of FIG. 3. Based on this trigger signal g, the rise and fall speeds (in accordance with the time constants predetermined by the differentiation elements) of the voltages at the switch transistor T (in a diagram h of FIG. 3) and at the load L, and the currents through the switch transistor T (Id in a diagram g of FIG. 3) and the free-wheeling or recovery diode (If in the diagram g of FIG. 3), and from or into the voltage source, are reduced in such a way that the aforementioned interference is largely eliminated.

FIG. 2 shows a second exemplary embodiment of the invention, which departs from the exemplary embodiment of FIG. 1 in that the current measuring device MI is disposed in the free-wheeling or recovery branch and not between the switch transistor T and the negative pole $-U$ of the voltage source, and therefore it measures the current that flows through the free-wheeling or recovery diode DI and not the current Id flowing through the switch transistor T. As a result of this provision, the inverting element V between the current measuring device MI and the differentiation element DIF1 can be omitted, since the current If is substantially equivalent to the inverted current Id, as seen in the diagram b of FIG. 3. The function of this variant circuit is equivalent to that in the exemplary embodiment of FIG. 1, and the courses of the voltages and current are also substantially equivalent to the courses shown in FIG. 3.

From a comparison of diagram b with diagram g and diagram c with diagram h in FIG. 3, it can be seen that in the circuits according to FIGS. 1 and 2, both the speed of the variation of the drain voltage UD and the speed of the variation of the load current Id flowing through the switch device T and therefore of the free-wheeling or recovery current If, can be adjusted to be substantially smaller than in the known circuit in the diagrams b and c of FIG. 3, in which it results on its own from the switch behavior of the transistor T.

Naturally it is possible, while departing from the examples shown, to make up the circuit with npn and pnp transistors, corresponding MOSFETs, and polarized voltages as well.

Figure 4:
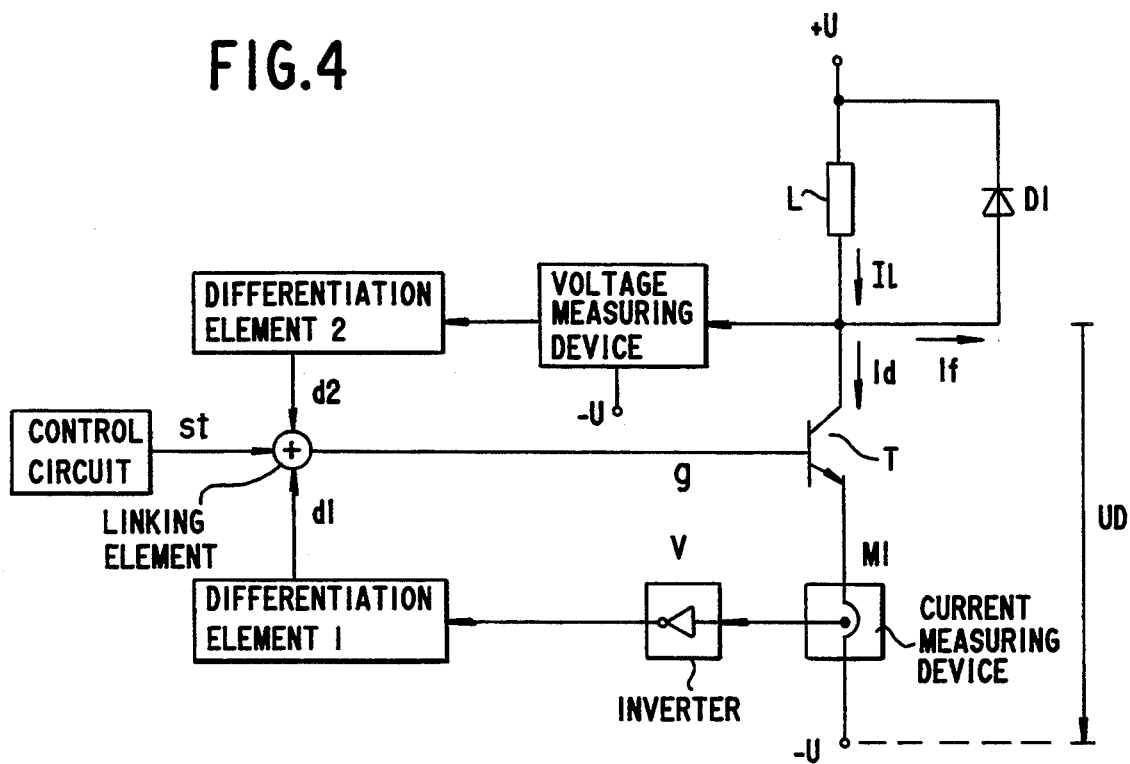
FIG. 4 is a block diagram showing the Transistor T as a bipolar transistor.

FIG. 4 is a block diagram showing transistor T as a bipolar transistor.

I claim:

1. A clocked power end stage, comprising:
an inductive load;
a free-wheeling circuit connected to said load;
a switch device having repetitive transitions between ON and OFF states, said switch device being connected to said load at a connection point disposed between said switch device and said load; a voltage source having a first pole connected to said load, and a second pole connected to said switch device, forming a series circuit through said load and said switch device; wherein said connection point has a voltage UD measured to said second pole;
a control circuit for generating a control clock signal for said switch device;
current measuring means connected to said switch device for measuring a load current flowing through said switch device for generating a current output signal proportional with the load current;
a first differentiation device with a predeterminable time constant being connected to said current measuring means for generating an output signal depending on a variation over time of the current output signal of said current measuring means;
voltage measuring means connected between said connecting point and said second pole, said voltage measuring means having an output providing an output voltage signal proportional with the voltage UD;
a second differentiation device with a predeterminable time constant having an input connected to said voltage measuring means for generating an output signal depending on a variation over time of the output signal of said voltage measuring means; and
a linking element having respective inputs connected to said first and second differentiation devices, and to said control circuit; and an output connected to said switch device for superimposing the output signals of said differentiation devices on the control clock signal for limiting speeds of variation of the load current and the load voltage.

2. The power end stage according to claim 1, wherein said switch device is a bipolar transistor.

3. The power end stage according to claim 1, wherein said switch device is an MOS transistor.

4. The power end stage according to claim 1, wherein said current measuring means measures a voltage proportional to the load current flowing through said switch device.

5. The power end stage according to claim 1, wherein said first differentiation device has an input, and including an inverting amplifier connected upstream of the input of said first differentiation device.

6. A clocked power end stage, comprising:
an inductive load;
a free-wheeling circuit connected to said load;
a switch device having repetitive transitions between ON and OFF states, said switch device being connected to said load at a connection point disposed between said switch device and said load; a voltage source having a first pole connected to said load, and a second pole connected to said switch device, forming a series circuit through said load and said switch device; wherein said connection point has a voltage UD measured to said second pole;
a control circuit for generating a control clock signal for said switch device;
current measuring means in said free-wheeling circuit for measuring the free-wheeling circuit current flowing through said free-wheeling circuit and generating a current output signal proportional to the free-wheeling current;
a first differentiation device with a predeterminable time constant being connected to said current measuring means for generating an output signal depending on a variation over time of the current output signal of said current measuring means;
voltage measuring means connected between said connecting point and said second pole, said voltage measuring means having an output providing an output voltage signal proportional with the voltage UD;
a second differentiation device with a predeterminable time constant having an input being connected to said voltage measuring means for generating an output signal depending on a variation over time of the output signal of said voltage measuring means; and
a linking element having respective inputs connected to said differentiation devices, and to said control circuit, and an output connected to said switch device for superimposing the output signals of said differentiation devices on the control clock signal for limiting speeds of variation of the load current and the load voltage.

7. The power end stage according to claim 6, wherein said switch device is a bipolar transistor.

8. The power end stage according to claim 6, wherein said switch device is an MOS transistor.

9. The power end stage according to claim 6, wherein said current measuring means measures a voltage proportional to the current flowing through said free-wheeling circuit.

* * * * *